(12) United States Patent
Starr et al.

(10) Patent No.: US 7,276,943 B2
(45) Date of Patent: Oct. 2, 2007

(54) HIGHLY CONFIGURABLE PLL ARCHITECTURE FOR PROGRAMMABLE LOGIC

(75) Inventors: Gregory W. Starr, San Jose, CA (US); Wanli Chang, Saratoga, CA (US); Kang Wei Lai, Milpitas, CA (US); Mian Z. Smith, Los Altos, CA (US); Richard Chang, Bloomfield, NJ (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/486,565

(22) Filed: Jul. 13, 2006

(65) Prior Publication Data

US 2006/0250168 A1 Nov. 9, 2006

Related U.S. Application Data

(63) Continuation of application No. 10/797,836, filed on Mar. 9, 2004, now Pat. No. 7,098,707.

(51) Int. Cl.
*H03L 7/06* (2006.01)
(52) U.S. Cl. ........................ 327/147; 327/156
(58) Field of Classification Search ................ 327/147, 327/149, 150, 152–159, 161–163; 331/17, 331/25, DIG. 2; 375/373–376
See application file for complete search history.

(56) References Cited

U.S. PATENT DOCUMENTS

| | | | |
|---|---|---|---|
| 3,473,160 A | 10/1969 | Wahlstrom | 326/41 |
| 5,212,723 A | 5/1993 | Griesshaber | 380/213 |
| 5,550,515 A | 8/1996 | Liang et al. | 331/11 |
| 5,689,195 A | 11/1997 | Cliff et al. | 326/41 |
| 5,909,126 A | 6/1999 | Cliff et al. | 326/41 |
| 5,969,558 A | 10/1999 | Abe | 327/292 |
| 6,081,141 A | 6/2000 | Young | 327/116 |
| 6,114,915 A | 9/2000 | Huang et al. | 331/25 |
| 6,215,326 B1 | 4/2001 | Jefferson et al. | 326/41 |
| 6,392,462 B2 | 5/2002 | Ebuchi et al. | 327/295 |
| 6,515,519 B1 | 2/2003 | Miyazaki et al. | 327/105 |
| 6,542,038 B2 | 4/2003 | Nishimura et al. | 331/1 A |
| 6,580,288 B1 | 6/2003 | Klapproth | 326/38 |
| 6,665,762 B2 | 12/2003 | Hofer | 710/300 |
| 6,720,810 B1 | 4/2004 | New | 327/158 |
| 6,856,180 B1 | 2/2005 | Starr et al. | 327/147 |
| 6,864,752 B2 | 3/2005 | Caresosa et al. | 331/16 |
| 2004/0208256 A1* | 10/2004 | Spijker et al. | 375/276 |

FOREIGN PATENT DOCUMENTS

WO    WO 02/097990    12/2002

OTHER PUBLICATIONS

Stratix Programmable Logic Device Family Data Sheet, Altera Corporation, Feb. 2002, pp. 76-104.

* cited by examiner

*Primary Examiner*—Linh My Nguyen
(74) *Attorney, Agent, or Firm*—Fish & Neave IP Group, Ropes & Gray LLP

(57) ABSTRACT

A programmable logic device includes configurable phase-locked loop (PLL) circuitry that outputs multiple clock signals having programmable phases and frequencies. Each output signal is programmably selectable for use as an external clock, internal global clock, internal local clock, or combinations thereof. The PLL circuitry has programmable frequency dividing, including programmable cascaded frequency dividing, and programmable output signal multiplexing that provide a high degree of clock design flexibility.

20 Claims, 17 Drawing Sheets

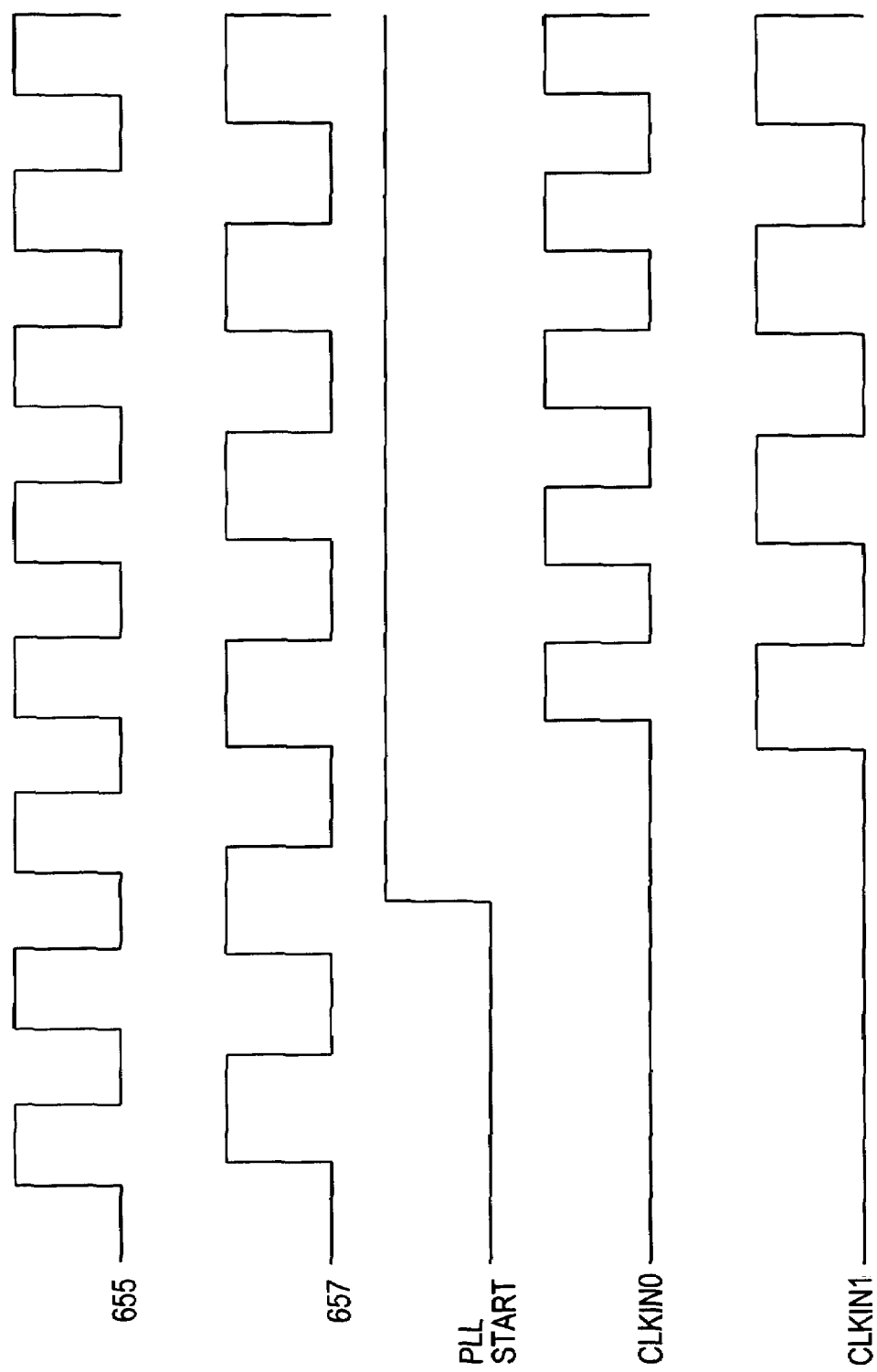

HIGHLY CONFIGURABLE PLL ARCHITECTURE FOR PROGRAMMABLE LOGIC

This is a continuation of U.S. patent application Ser. No. 10/797,836, filed Mar. 9, 2004, now U.S. Pat. No. 7,098,707, which is hereby incorporated by reference herein in its entirety.

BACKGROUND OF THE INVENTION

This invention relates to programmable logic integrated circuit devices, and more particularly to configurable phase-locked loop (PLL) circuitry for programmable logic devices.

Programmable logic integrated circuit devices are well known and often include large numbers of programmable logic blocks, memory blocks, and programmable interconnection resources. Logic blocks are programmable by a user to perform various logic functions desired by the user. Memory blocks may be used by the user to store and subsequently output data. Interconnection resources are programmable by the user to make any of a wide range of connections between inputs of the programmable logic device and inputs of the logic and memory blocks, between outputs of the logic and memory blocks and outputs of the device, and between outputs and inputs of the magic and memory blocks. Although each logic block is typically able to perform only a relatively small logic task, such interconnections allow the programmable logic device to perform extremely complex logic functions.

Providing PLL circuitry on programmable logic devices is also well known. PLL circuitry produces an output signal that is continually adjusted to maintain a constant frequency and phase relationship with an input reference signal (the PLL circuitry thus "locks" onto that frequency and phase relationship). PLL circuitry may be used to counteract clock signal propagation delay on the programmable logic device, convert from one clock signal frequency (e.g., an input clock signal frequency) to another different clock signal frequency (e.g., to be output by the device), and more generally to provide one or more external clock signals, internal global clock signals, or internal local/regional clock signals.

The configurability of known PLL circuitry, however, is typically limited. For example, the frequency range of output signals produced by known PLL circuitry may be too narrow for many applications in which a programmable logic device could be used. Furthermore, the number and configurability of PLL outputs may be too limited. For example, known PLL circuitry may not have enough outputs available for connection to I/O pins for off-chip clocking applications. Moreover, known PLL circuitry may not have enough outputs available for connection to on-chip global or local clocking networks. Thus, the configurability of known PLL circuitry on programmable logic devices may limit the number of designs that can be implemented on the device and thus the number of applications in which a programmable logic device could otherwise be used.

In view of the foregoing, it would be desirable to be able to provide highly configurable PLL circuitry in order to increase the number of designs and applications in which programmable logic devices can be used.

SUMMARY OF THE INVENTION

In accordance with the invention, programmable logic devices are provided with highly configurable phase-locked loop (PLL) circuitry. PLL circuitry of the invention outputs multiple signals of which each can be programmably connected to any or all of the following: one or more I/O pins for use as an external (e.g., off-chip) clock, one or more internal (e.g., on-chip) global clock networks, one or more internal local/regional clock networks, and combinations thereof. The PLL circuitry performs phase-shifting with respect to an input reference signal such that each output signal can have a different phase if desired. Furthermore, the frequency of each output signal can be individually programmed. In other embodiments of the invention, PLL outputs can be programmably cascaded in selectable numbers of stages to provide output signal frequency ranges that are orders of magnitude wide. In still other embodiments of the invention, PLL circuitry can receive multiple input signals (e.g., from off-chip and/or on-chip sources) from which a reference signal can be programmably selected.

Methods of providing such clock signal outputs are also provided in accordance with the invention.

Advantageously, PLL circuitry and methods of the invention can be used to implement a wide range of designs including, for example, frequency synthesizers and zero delay buffers. This notably increases the number of designs and applications in which a programmable logic device can be used.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 6a is a timing diagram of signals from FIG. 6;

DETAILED DESCRIPTION OF THE INVENTION

Figure 1:
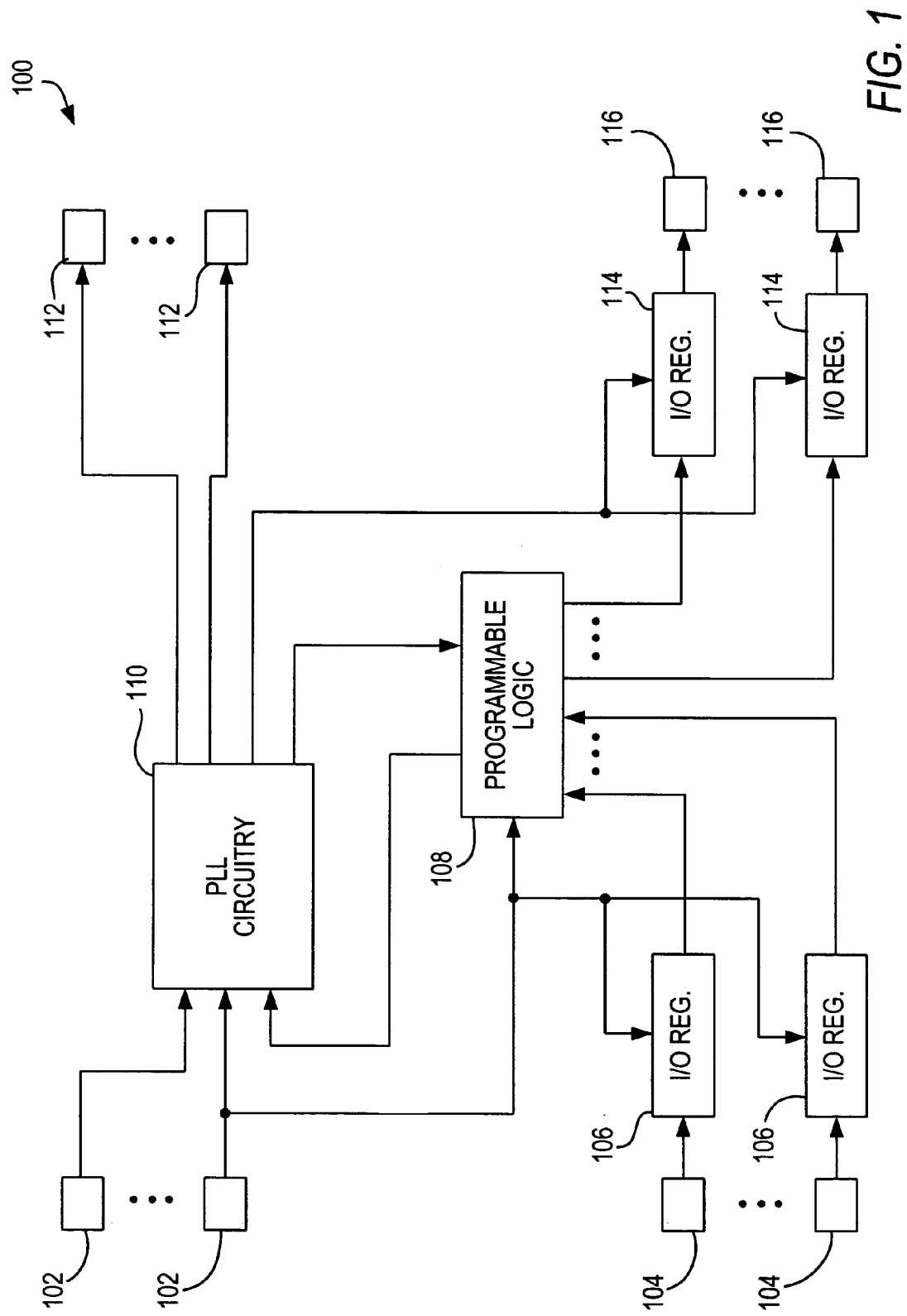
FIG. 1 is a simplified block diagram of an illustrative embodiment of representative portions of a programmable logic integrated circuit device according to the invention.

FIG. 1 shows an illustrative programmable logic integrated circuit device (PLD) 100 in accordance with the invention. PLD 100 has one or more clock signal input pins 102 for receiving one or more clock signals from circuitry external to the device. PLD 100 also includes a plurality of input/output ("I/O") pins 104 for receiving data and/or control signals from external circuitry. (For convenience herein, all data and control signals other than clock signals will be referred to simply as data signals.) The data signals from pins 104 may be applied to I/O registers 106 for temporary storage and output by those registers. An input clock signal applied to a pin 102 may be applied to I/O registers 106 to control the operation (in particular, the timing) of those registers. The data signals output by registers 106 are applied to programmable logic 108 of PLD 100. (As an alternative to using registers 106, data from pins 104 may be applied more directly to logic 108 (i.e., without first being input to registers 106).) Programmable logic 108 may also receive an input clock signal from a pin 102 and generally performs at least some operations on the input data from pins 104 and/or registers 106 at a rate determined by the frequency of a received clock signal. In other words, some or all of the data applied to pins 104 may be synchronized with a clock signal received from a pin 102, and programmable logic 108 may partially process that data in synchronism with that clock signal.

Multiple input clock signals applied to pins 102 may be applied to phase-locked loop ("PLL") circuitry 110 in accordance with the invention. PLL circuitry 110 may also receive an internal clock signal from programmable logic 108, which may have been generated on PLD 100 and/or derived from another clock signal received from one of clock pins 102. PLL circuitry 110 programmably selects one of the input clock signals for use as an input reference signal and provides multiple modified clock output signals which have desired frequency relationships to the input reference signal. For example, the frequencies of the modified clock output signals produced by PLL circuitry 110 may be higher and/or lower than the input reference signal frequency. The modified clock signals produced by PLL circuitry 110 advantageously may be programmably applied to any or all of clock signal output pins 112, programmable logic 108, and I/O registers 114.

Programmable logic 108 can be configured to perform at least some data processing at one or more rates determined by the one or more modified clock signals produced by PLL circuitry 110. For example, programmable logic 108 may perform some data processing in synchronism with a modified clock signal produced by PLL circuitry 110. Output data signals from programmable logic 108 may be applied to I/O pins 116, possibly via I/O registers 114, which may register those data signals on their way to pins 116 at possibly another modified clock signal rate. Furthermore, PLD 100 may output data via pins 116 at a modified clock signal frequency that may or may not be the same as, and/or in synchronism with, any of the modified clock signals applied to output clock pins 112.

Note that in other embodiments of the invention (see, e.g., FIG. 10 and its accompanying description below), pins 102 and 112 may be dynamically used as either clock or data I/O pins.

Although FIG. 1 may appear to show fixed interconnections among the various circuit elements, note that on a programmable logic device such as PLD 100 there is typically a high degree of programmability and therefore signal routing flexibility in the interconnection resources that are provided. This programmability of interconnection resources, which is well known in the art, is not shown to avoid unnecessarily complicating the FIGS. Thus not all of the interconnections shown in FIG. 1 (or in any of the subsequently described FIGS.) may be present in all uses of PLD 100, and/or other interconnections not shown in FIG. 1 (or other FIGS.) may be present in some uses of PLD 100. Those skilled in the art will also appreciate that the circuit elements and interconnection resources shown in FIG. 1 may be only a part of more extensive circuit element and interconnection resources provided on PLD 100. Examples of programmable logic devices in which the invention can be implemented are found in Cliff et al. U.S. Pat. No. 5,689,195; Cliff et al. U.S. Pat. No. 5,909,126; and Jefferson et al. U.S. Pat. No. 6,215,326; all of which are hereby incorporated by reference herein in their entireties.

Figure 2:
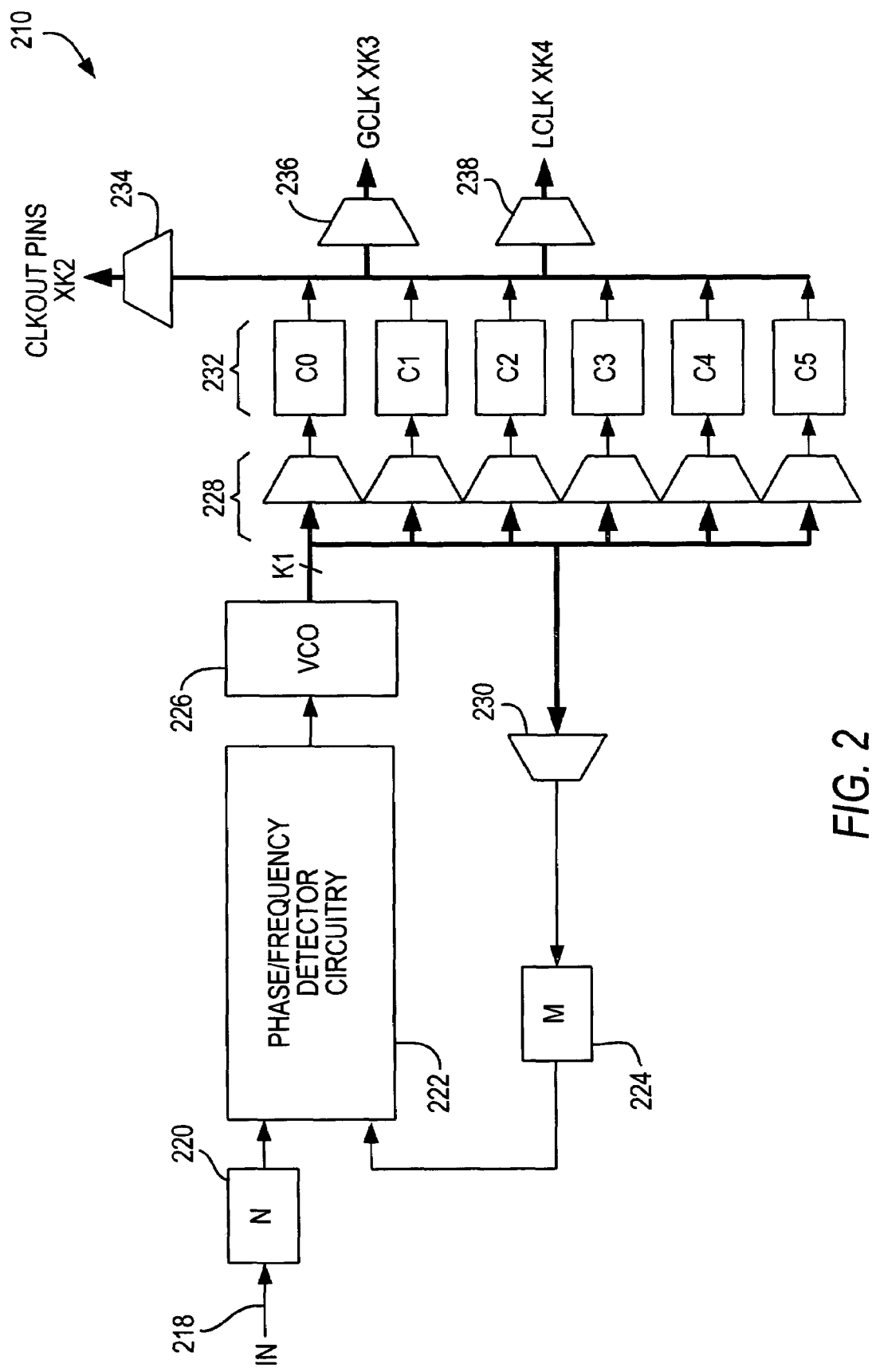
FIG. 2 is a simplified block diagram of a first embodiment of PLL circuitry according to the invention.
Figure 3:
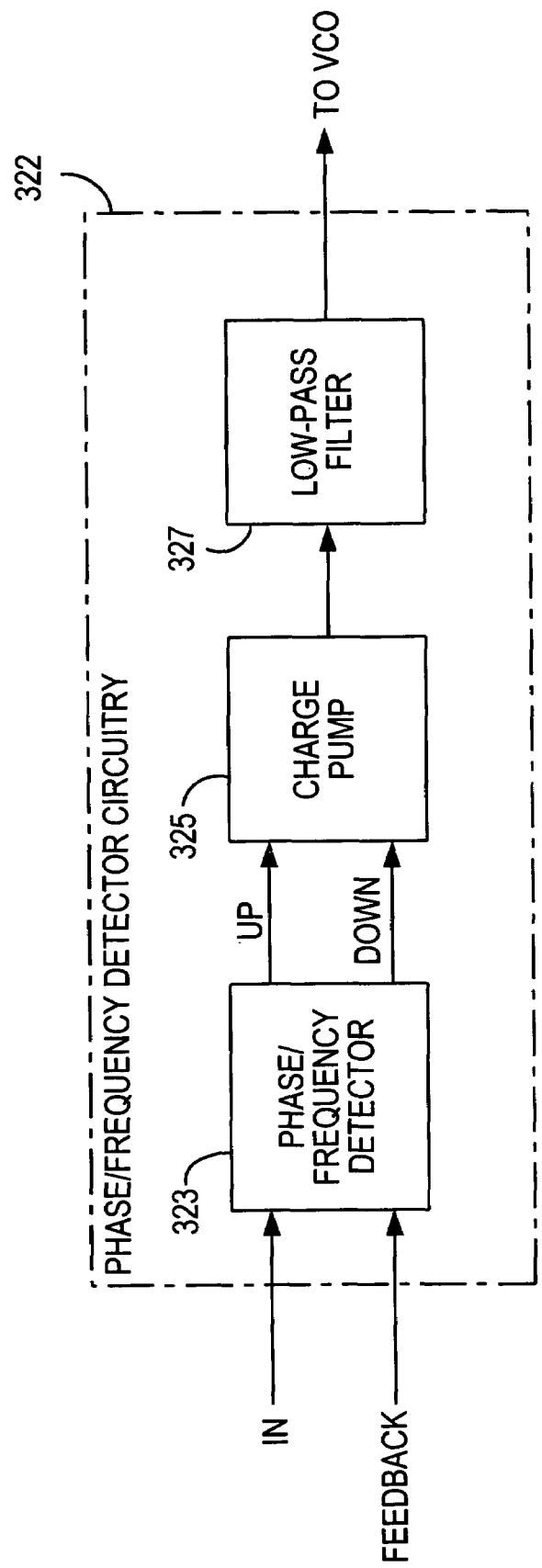
FIG. 3 is a more detailed, but still simplified block diagram of a typical portion of the PLL circuitry of FIG. 2.

FIG. 2 shows an embodiment of PLL circuitry in accordance with the invention. PLL circuitry 210 receives an input reference signal via input 218 (unlike PLL circuitry 110, only one input signal is received in this embodiment). That input signal is applied to prescale frequency divider 220. Divider 220 divides the frequency of the input reference signal by a factor N, which is preferably a programmable parameter of PLD 100 stored in, for example, a programmable function control element of PLD 100. The output of divider 220 is applied as a driving clock signal to one input of phase/frequency detector (PFD) circuitry 222. PFD circuitry 222, which can be conventional, also receives the output signal of feedback frequency divider 224. PFD circuitry 222 produces an output signal which is indicative of the phase/frequency difference between the two signals applied to it. (A more complete depiction of PFD circuitry 222 is shown in FIG. 3 and described below). The output signal of PFD circuitry 222 is applied as a control signal to voltage controlled oscillator (VCO) 226. VCO 226 produces k1 output signals (where K1 is an integer), each of which is phase-shifted by preferably an increasing multiple of 360°/k1. In one embodiment, for example, VCO 226 may output six signals (i.e., k1=6), wherein the output signals are each preferably phase-shifted with respect to the input reference signal at 60° intervals (e.g., 60°, 120°, 180°, 240°, 300°, and 360°). In another embodiment, for example, eight signals may be output (resulting in 45° phase shift increments). The output signals of VCO 226 are applied to multiplexer circuitry 228 and feedback multiplexer 230.

Multiplexer 230 feeds one of the VCO 226 output signals to feedback frequency divider 224. The particular VCO 226 output signal fed to divider 224 can be fixed by design, programmed by a user, or rotated or alternated among the VCO 226 output signals by control logic that either is fixed by design or programmed by a user. Divider 224 divides the frequency of the signal applied to it by factor M to produce the above-mentioned second (feedback) input to PFD circuitry 222. Factor M is preferably a programmable parameter of PLD 100 stored in, for example, a programmable function control element of PLD 100.

Multiplexer circuitry 228 receives all k1 VCO 226 output signals and programmably selects which of those signals to feed to post-scale frequency-divider circuitry 232. Divider circuitry 232 preferably includes multiple counter/frequency-divider circuits, which in the embodiment shown in FIG. 2 is six. Note that the number of individual counter or frequency-divider circuits does not have to equal the number of VCO output signals. Multiplexer circuitry 228 is preferably programmable by a user, but may alternatively be fixed to output, for example, each VCO output signal to a respective one of the individual frequency-divider circuits, assuming the number of divider circuits equals the number of VCO output signals. Each individual divider circuit divides the frequency of the signal applied to it by its corresponding factor C0-Cn1 (where n1 is an integer and in FIG. 2 equals five). Each of factors C0-Cn1 is preferably an independently programmable parameter stored in, for example, one or more programmable function control elements of PLD 100. Thus, each of factors C0-Cn1 may be different, the same, or combinations thereof.

The resulting output signals of post-scale frequency-divider circuitry 232 are applied to multiplexers 234, 236, and 238. Multiplexers 234, 236, and 238 are each dynamically programmably controlled to output any one of their inputs to any one of their outputs. Multiplexer 234 couples selected signals to up to k2 clock I/O pins (CLKOUT; e.g., pins 112 of FIG. 1). Constant k2 is an integer typically less than or equal to k1. For example, if k1 is equal to eight, k2 may be equal to six. Multiplexer 236 couples selected signals to up to k3 global clock (GCLK) networks. Constant k3 is also an integer typically less than or equal to k1. Thus, for example, if k1 is equal to eight, k3 may be equal to four. Lastly, multiplexer 238 couples selected signals to up to k4 local clock (LCLK) networks. Constant k4 is likewise an integer typically less than or equal to k1. For example, if k1 is equal to eight, k4 may also be equal to eight. Moreover, the eight may be two groups of the same four signals for use in two local regions designed to have the same clocking.

Figure 2A:
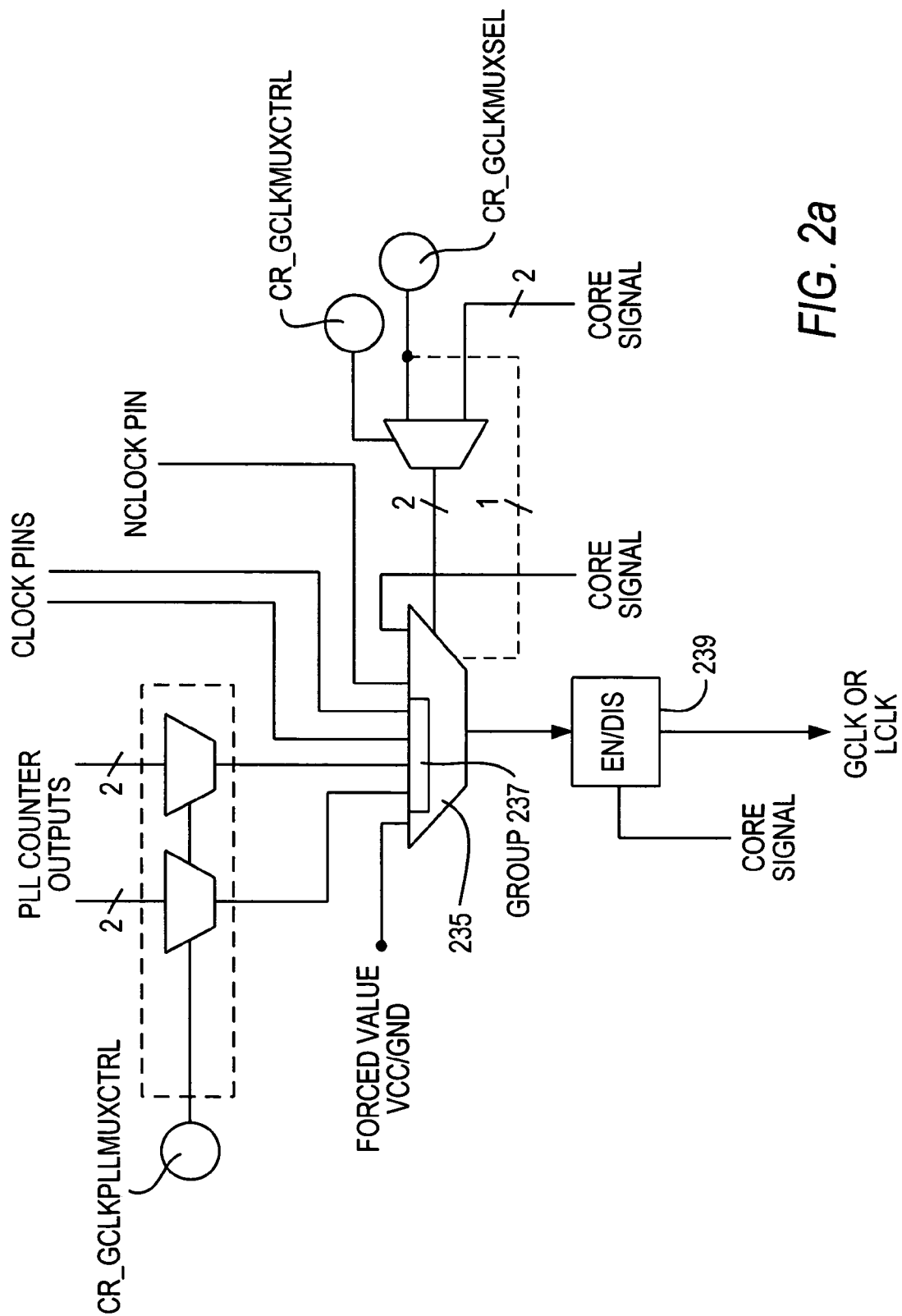
FIG. 2a is a simplified block diagram of an embodiment of a dynamically configurable multiplexer according to the invention.
Figure 11:
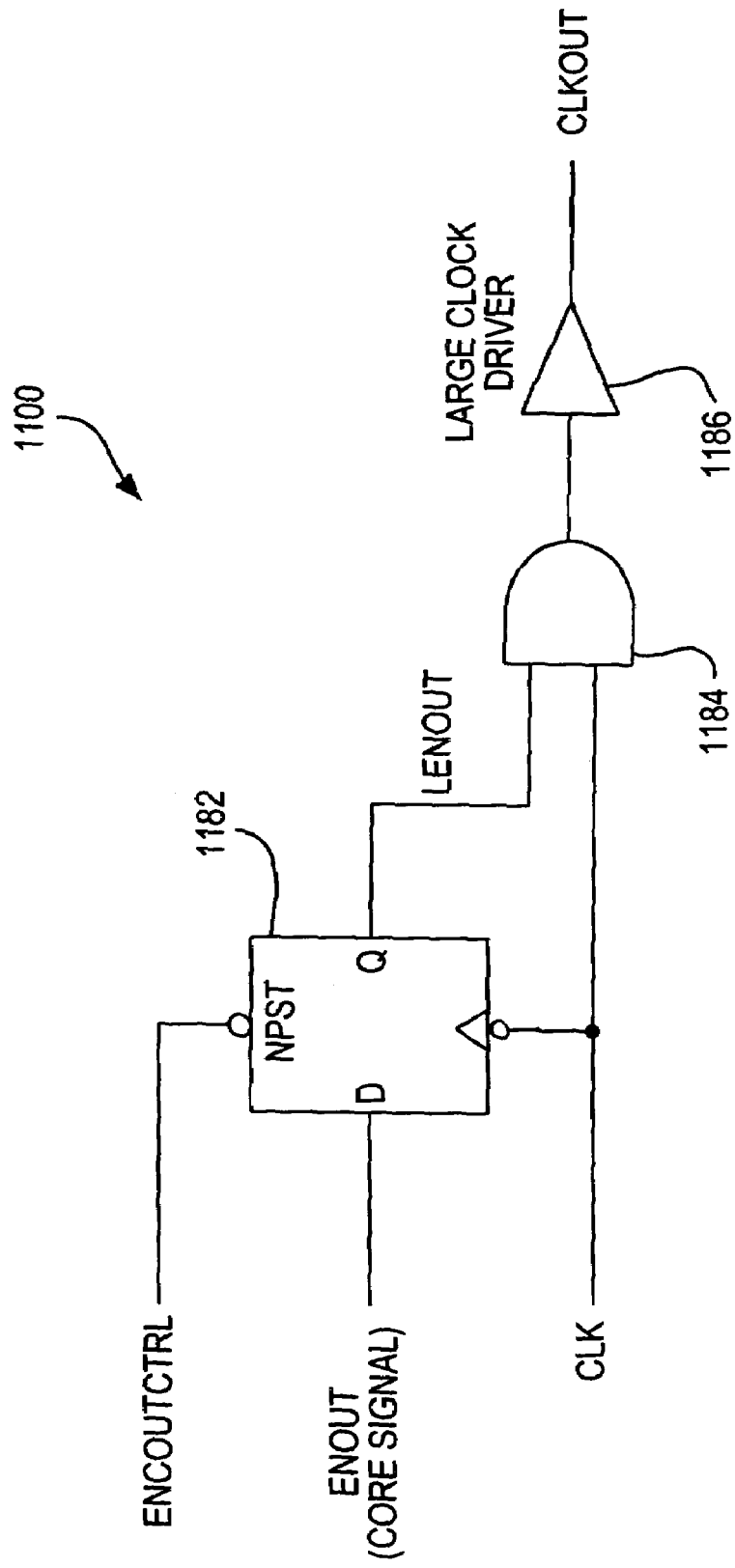
FIG. 11 is a simplified block diagram of PLL enablement circuitry according to the invention.

FIG. 2a shows an embodiment of a dynamically configurable multiplexer that can be used for each of multiplexers 234, 236, and 238 in accordance with the invention. Multiplexer 235 includes a group 237 of inputs which are dynamically selectable by a user. Advantageously, multiplexer 235 allows any one of a PLL output, clock pin, or core signal, for example, to be selectably driven onto, for example, a global (gclk) or local (lclk) clock network. Signals CR_GCLKMUXCTRL and CR_GCLKMUXSEL are programming bits used to either configure multiplexer 235 to be dynamically reconfigurable or fixed (i.e., not dynamically reconfigurable). An embodiment of enablement circuitry 239 is shown in FIG. 11 and described further below.

Advantageously, PLL circuitry 210 provides a high degree of configurability. For example, by appropriately programming multiplexer circuitry 228 and divider circuitry 232, the six modified clock signals produced by circuitry 232 can have different phases and different frequencies, different phases and the same frequencies, the same phase and different frequencies, or combinations thereof. Moreover, each of the six modified clock signals can be programmably routed where needed. None are limited or partitioned to only particular circuits, I/O pins, or uses.

FIG. 3 shows an embodiment of phase/frequency detector (PFD) circuitry 222. PFD circuitry 322 typically includes a phase/frequency detector circuit 323, which receives the input and feedback clock signals. Detector circuit 323 produces "up" or "down" output signal pulses depending on whether the phase of the input clock signal leads or lags the phase of the feedback clock signal. The width of the "up" or "down" signal pulses is typically controlled by detector circuit 323 to be proportional to the phase difference between the input and feedback clock signals. The "up" or "down" signals are fed to charge pump circuit 325, which provides a transfer function of those signals to an output signal voltage at a level between the power supply voltage of PLD 100 and ground. The "up" and "down" signals switch an internal current source to deliver a charge to move the charge pump output signal voltage up or down during each clock cycle. The output signal of charge pump circuit 325 is applied to low-pass filter circuit 327, which smoothes the signal for application as a control signal to an associated VCO (e.g., VCO 226). In sum, when the phase of the input clock signal leads the phase of the feedback clock signal, an "up" signal is generated by detector circuit 323. This results in an increase in the frequency of the feedback clock signal. Conversely, when the phase of the input clock signal lags the phase of the feedback clock signal, detector circuit 323 produces a "down" signal, which causes a decrease in the frequency of the feedback clock signal.

Figure 4:
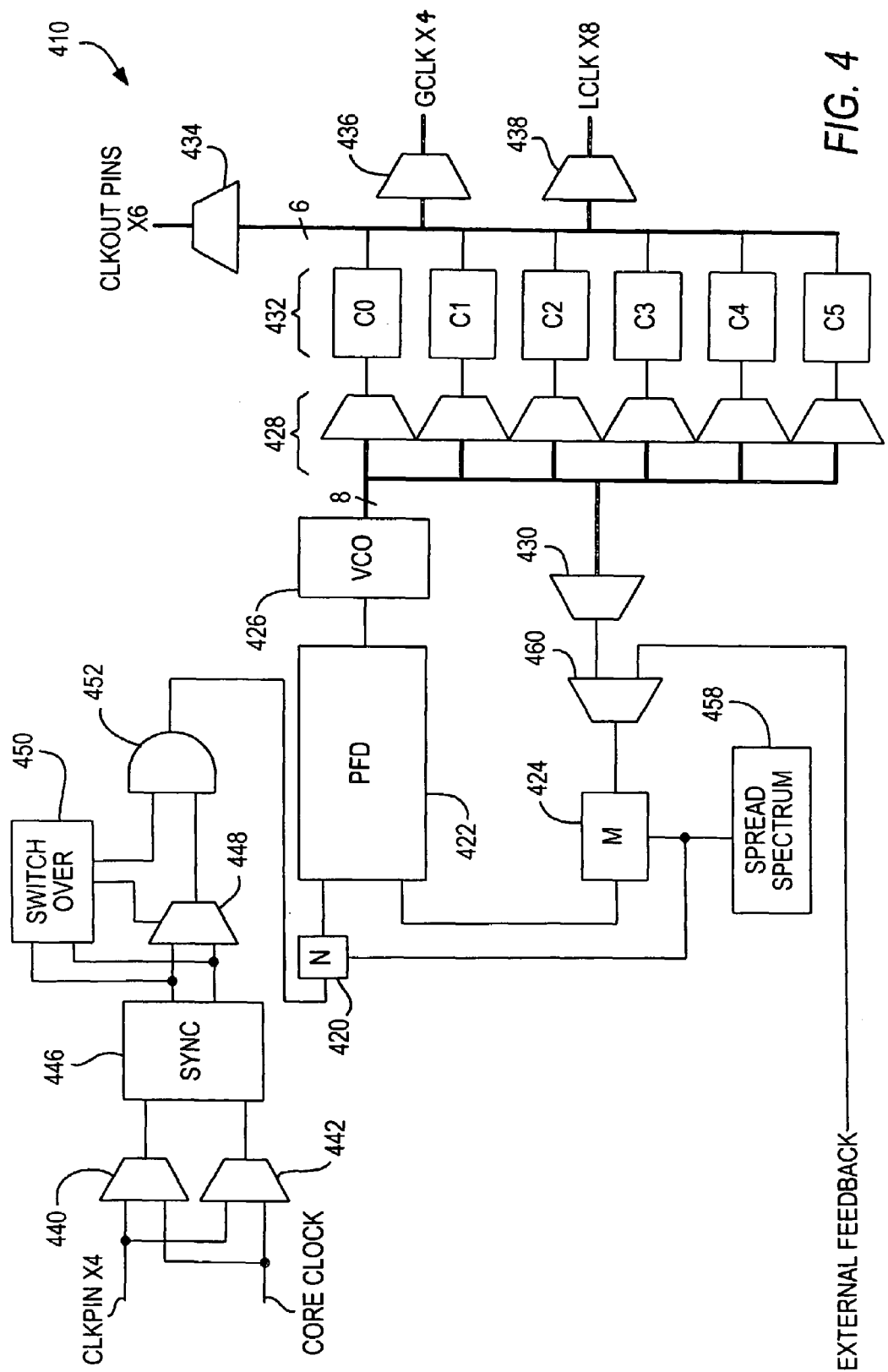
FIG. 4 is a simplified block diagram of another embodiment of PLL circuitry according to the invention.

FIG. 4 shows another embodiment of PLL circuitry in accordance with the invention. PLL circuitry 410 includes prescale frequency divider 420, phase/frequency detector (PFD) circuitry 422, voltage controlled oscillator (VCO) 426, multiplexer circuitry 428, feedback multiplexer 430, post-scale frequency-divider circuitry 432, and multiplexers 434, 436, and 438. These elements operate similarly, if not identically, to the corresponding elements of PLL circuitry 210. Note that the number of outputs shown in FIG. 4 for VCO 426 (8 outputs), multiplexer circuitry 428 (6 outputs), multiplexer 434 (6 outputs), multiplexer 436 (4 outputs), and multiplexer 438 (8 outputs) are merely illustrative and that these elements may be configured or replaced with other elements to have more or less outputs.

PLL circuitry 410 advantageously has enhanced input signal selection and synchronization capability. PLL circuitry 410 includes multiplexers 440, 442, and 448, synchronizing circuit 446, switchover circuit 450, and AND gate 452. Multiplexers 440 and 442 both receive multiple input signals from a number of clock input pins (which in this embodiment is four; note that other numbers of input signals from clock pins may be used). These clock input pins are preferably closely located and available as a matched reference to PLL circuitry 410. Any of these pins may be used for I/O delay compensation and clock network delay compensation. These pins may be used, for example, by memory interfaces, such as for RLDRAM (reduced latency dynamic random access memory).

Multiplexers 440 and 442 both also receive a core input clock signal, which may be an internal clock signal originating from any clock pin on the chip or it may be generated by another PLL on the chip. Advantageously, this input, if selected, allows the PLL reference clock signal to come from another PLL on the chip via, e.g., PLL cascading. A single reference clock can therefore be used to drive multiple PLLs, rather than having separate clocks (typically requiring respectively separate I/O clock pins) drive respective PLLs. This feature is particularly useful for multiple PCI interfaces, multiple memory interfaces, and those interfaces adhering to known source synchronous protocols where multiple transmit channels using a common reference clock are required.

Figure 5:
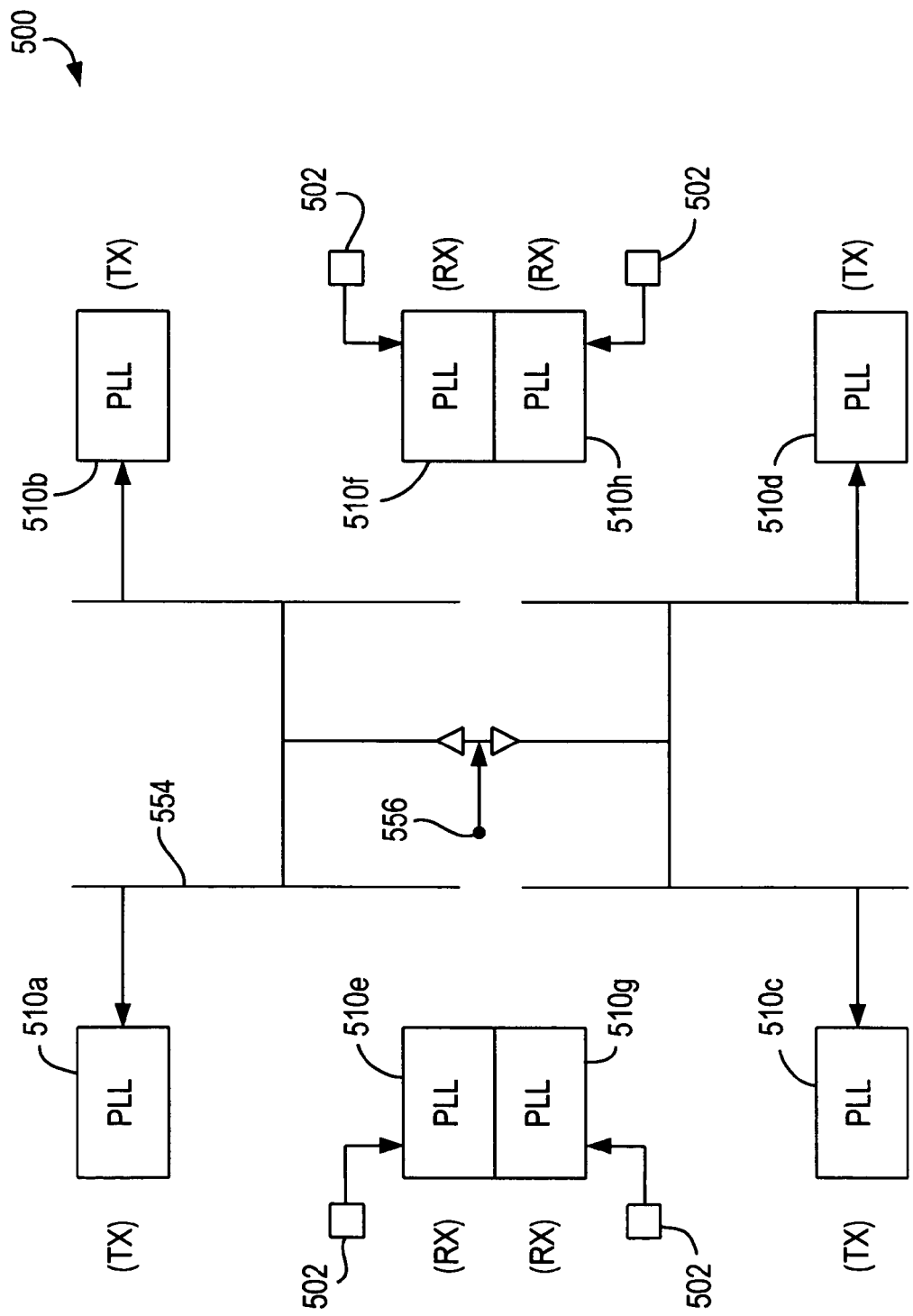
FIGS. 5, 5a, and 5b are simplified block diagrams illustrating programmable logic integrated circuit devices employing PLLs configured in transmit and receive modes according to the invention.

FIG. 5 shows an embodiment of a PLD in accordance with the invention in which a core clock signal is used to drive multiple PLL circuitries adhering to a source synchronous protocol. PLD 500 includes core clock network 554 and PLL circuitries 510a-h, which are each preferably LVDS PLL circuitries. LVDS (low voltage differential signaling) is a signaling protocol employing very low voltages and differential signaling, which involves the transmission of pairs of signals that propagate in parallel. Each signal is usually a logical complement of the other. That is, when one signal is at a high voltage (e.g., a logical 1), the other is at a low voltage (e.g., a logical 0), and vice versa. LVDS PLL circuitries 510*a-d* operate in transmit mode (TX), while LVDS PLL circuitries 510*e-h* operate in receive mode (RX). (Note that PLL circuitries 510*a-h* can each operate in either or both modes in accordance with the invention). RX PLL circuitries 510*e-h* receive external clock signals from clock pins 502 and generate modified clock signals that can be used on-chip, off-chip, or both. TX PLL circuitries 510*a-d* each receive a core clock signal that can enter clock network 554 at node 556. This core clock signal may be driven by any clock pin or by any general purpose or LVDS PLL circuitry output. This core clock signal can advantageously serve as the input reference signal to LVDS PLL circuitries 510*a-d*, which then generate modified clock signals that can be used on-chip, off-chip or both.

Figure 5A:
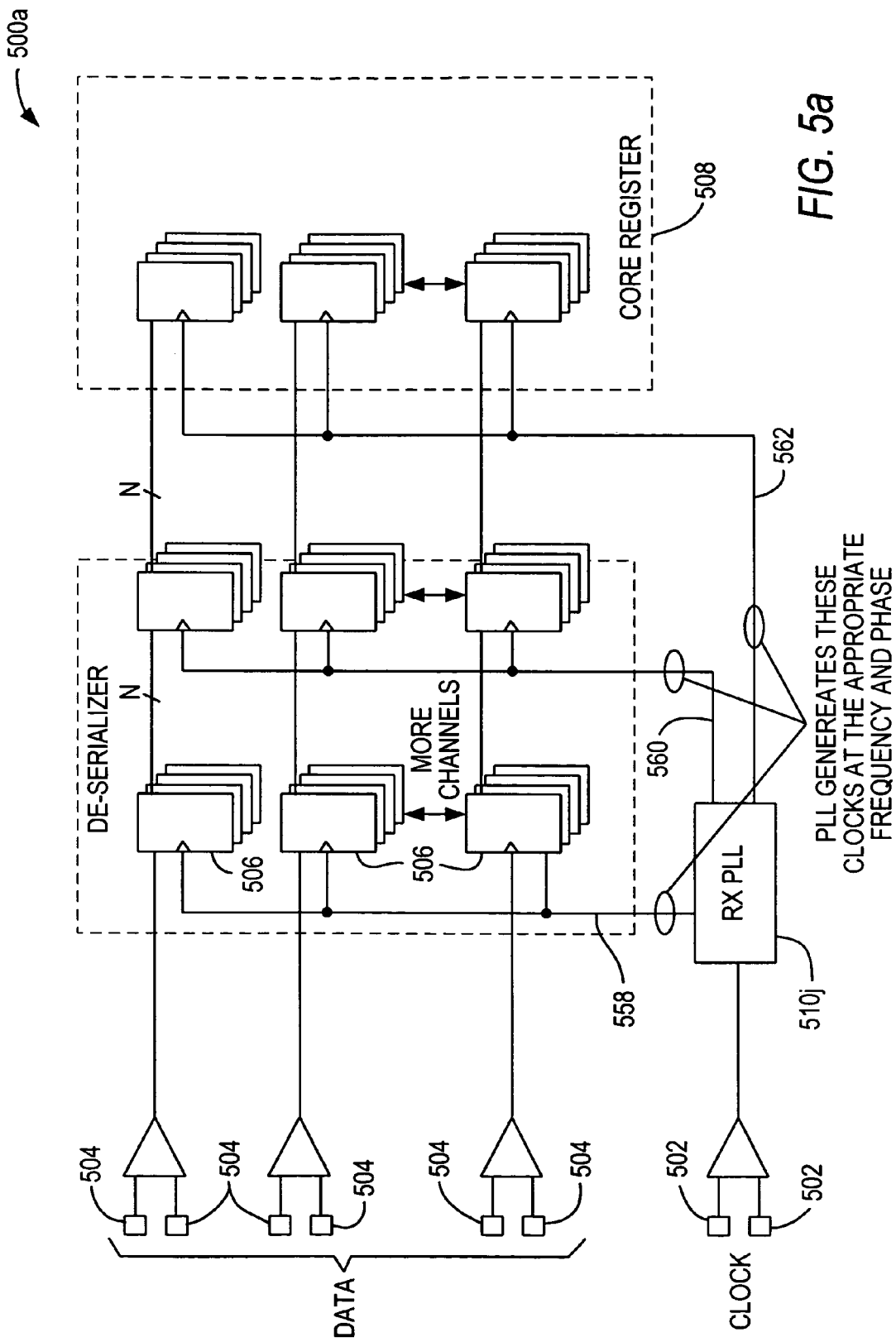

FIG. 5*a* further illustrates PLL circuitry operating in receive mode. PLL circuitry 510*j* receives an external clock from clock pins 502. This external clock has its edge in a particular phase relationship with data being received at I/O pins 504. PLL circuitry 510*j* generates several clocks. One is a high speed clock at output 558 used for registers 506, which are closest to the I/O pins. A second clock at output 560 is at a lower speed. It is equal to the high speed clock frequency divided by a deserialization factor. A common deserialization factor is 8, resulting in a clock frequency ⅛ the frequency of the clock at output 558. This second clock is routed to a second set of registers. A third clock at output 562 typically has the same frequency as the second clock and is routed to registers in programmable logic 508. Multiple registers are used for each data channel, and the number of registers preferably equals the deserialization factor. PLL circuitry 510*j* advantageously establishes and maintains the phase relationship and frequency of clocks at outputs 558, 560, and 562 with respect to the external clock. Note that in receive mode, PLL circuitry 510*j* uses only the reference clock sent with the data. Thus, individual PLL circuitry is used for each interface, because each interface can have a different phase of frequency relationship.

Figure 5B:
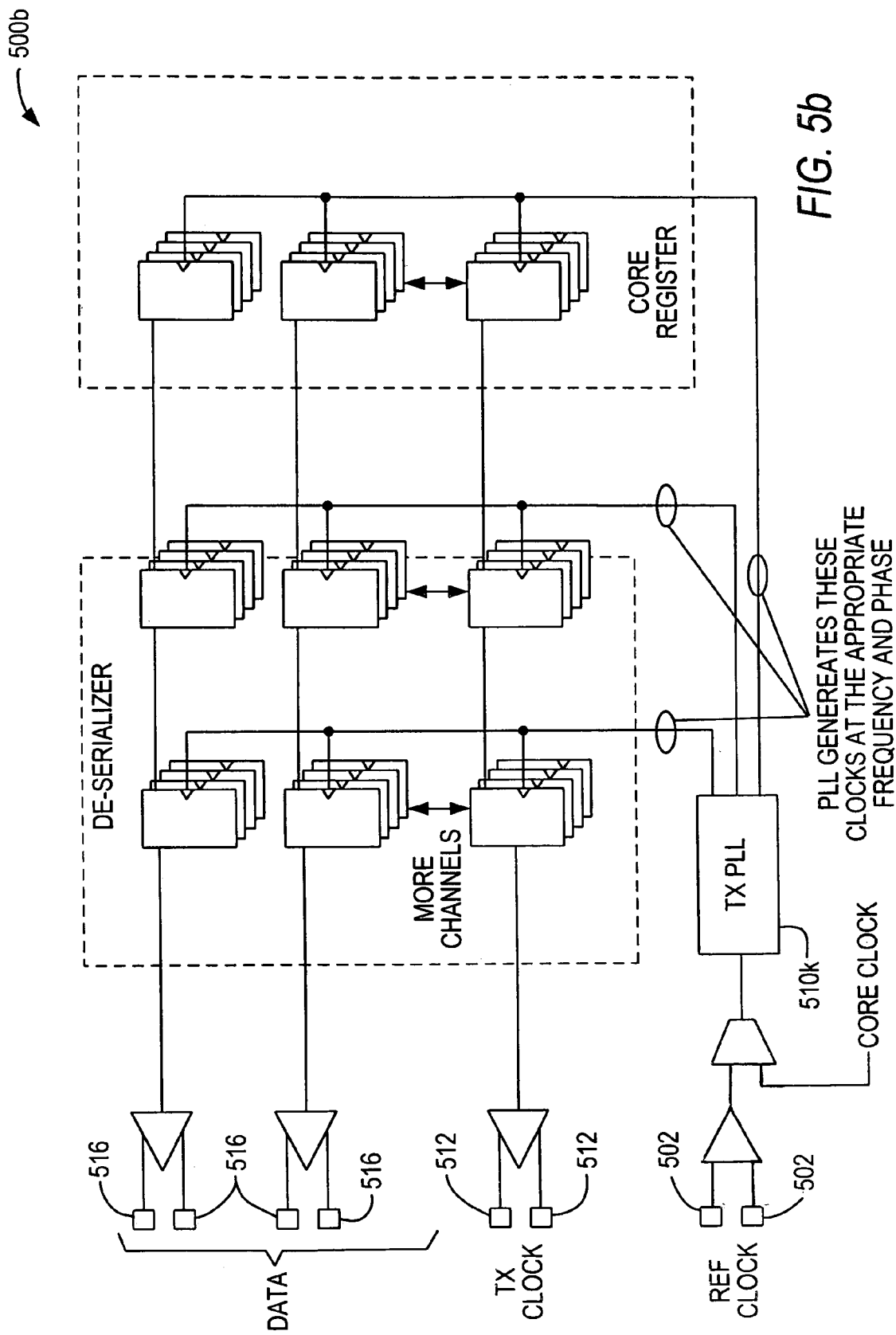

FIG. 5*b* further illustrates PLL circuitry operating in transmit mode. In transmit mode, the source synchronous channel sends out both data (at I/O pins 516) and a TX clock (at clock pins 512). PLL circuitry 510*k* can therefore receive a reference clock from any pin or internally generated core clock because no phase relationship is required between this reference clock and the TX data and clock. If multiple channels are required, a single core clock advantageously can be used to drive multiple TX PLL circuitries, as shown in FIG. 5.

Returning to FIG. 4, multiplexers 440 and 442 are programmable preferably by a user to select two of the multiple input signals to feed to synchronizing circuit 446. Synchronizing circuit 446 ensures that the start-up of PLL circuitry 410 occurs in a synchronous manner. In particular, circuit 446 is intended to prevent glitches on the reference clock signal, which could result in erroneous timing for PLL circuitry 410.

Figure 6:
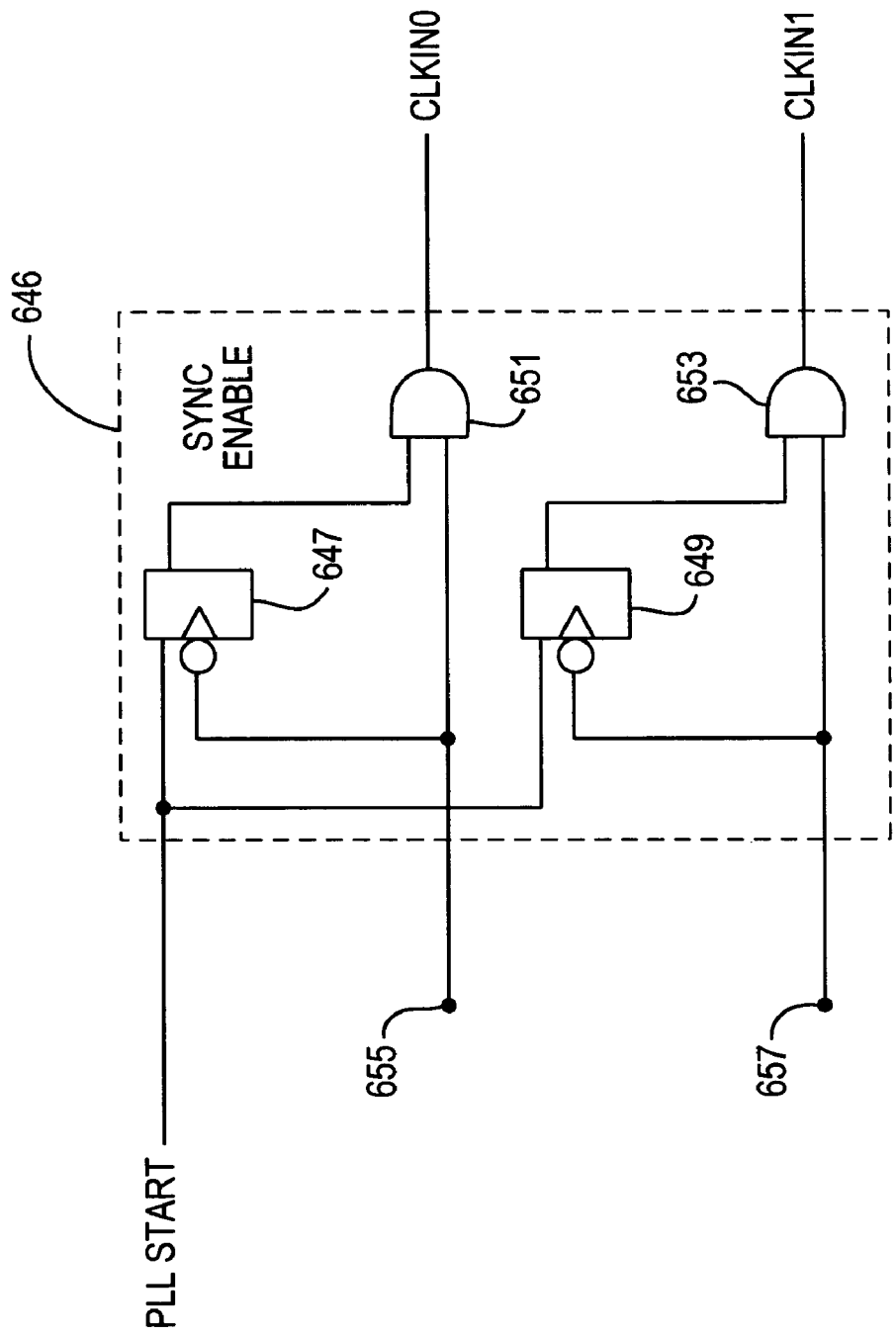
FIG. 6 is a simplified block diagram of a synchronizing circuit for PLL circuitry according to the invention.

FIG. 6 shows an embodiment of a synchronizing circuit in accordance with the invention synchronizing circuit 646 includes latches 647 and 649 and AND gates 651 and 653. Latch 647 receives at input 655 the input signal selected by multiplexer 440, while latch 649 receives at input 657 the input signal selected by multiplexer 442. A PLL start signal enables the reference clock on the falling Edge to ensure that adequate time is allowed before the next rising edge of the clock. Corresponding waveforms are shown in FIG. 6*a*.

Figure 6B:
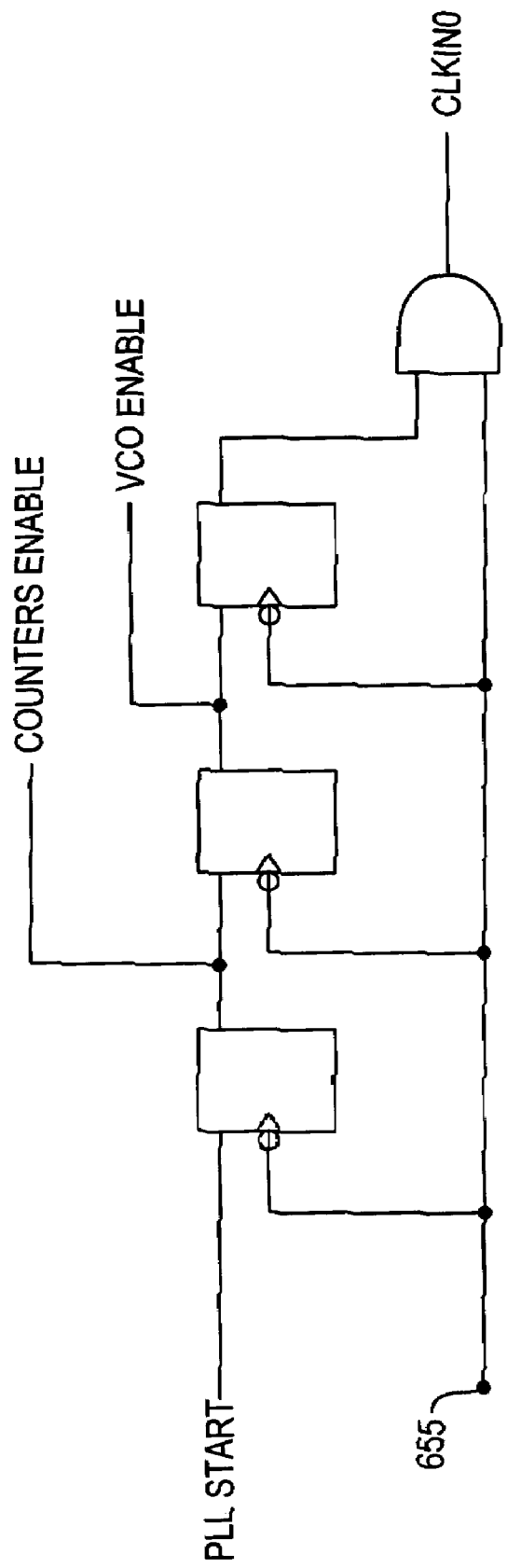
FIG. 6b is a simplified block diagram of an alternative portion of the synchronizing circuit of FIG. 6 according to the invention.

Additional registers could be inserted to delay the enabling of the reference clock to allow portions of the PLL circuitry to be enabled before the two output signals, CLKIN0 and CLKIN1, begin toggling. This alternative embodiment is illustrated in FIG. 6*b*, where the PLL start signal is used to generate a staged start-up sequence that first enables the counters/frequency dividers and then the VCO.

Returning to FIG. 4, the two synchronizing circuit outputs are fed to multiplexer 448 and switchover circuit 450. Multiplexer 448 is programmable by a user and accordingly outputs one of the two signals selected by the user to serve as the input reference signal. The selected input reference signal is fed to AND gate 452, which also receives an input signal from switchover circuit 450. In normal operating mode, switchover circuit 450 allows the selected reference signal to propagate through AND gate 452 to prescale frequency divider 420. Switchover circuit 450 monitors the two output signals received from synchronizing circuit 446. If the selected clock signal stops running for some reason, switchover circuit 450 will automatically cause the other output signal from synchronizing circuit 446 to be used as the input reference signal. This feature can be used for clock redundancy or for a dual clock domain application. Moreover, switchover circuit 450 can be preferably manually controlled based on a user control signal. This allows a user, for example, to switch between two input reference signals of different frequencies.

PLL circuitry 410 further has enhanced feedback capability and includes feedback frequency divider 424, spread spectrum counter 458, and multiplexer 460. Multiplexer 460 is programmable and receives an output signal from multiplexer 430 and an external feedback signal. By programming multiplexer 460 to output the external feedback signal, an external clock signal can be aligned with the input reference clock signal. This advantageously allows a user to remove clock delay and skew between devices/chips. Spread spectrum counter 458 helps prevent corrupted data and intermittent system errors that can be caused by radiated noise from high frequency clock signals. Spread spectrum counter 458, which is coupled to frequency dividers 420 and 424, accomplishes this by modulating clock frequencies over a small range.

PLL circuitries 210 and 410 are both advantageously fully programmable both at power up and during user mode (i.e., dynamically), thus providing a high degree of flexibility. Programmable parameters include coarse and fine phase shifting, counter values (i.e., frequency divisors), and duty cycle. As mentioned previously, each counter/frequency divider circuit of frequency-divider circuitries 232 and 432 can be connected to several different output sources including global clock networks, local clock networks, and external clock buffers. By providing these flexible multiplexing regions on the divider circuit outputs, a user can advantageously configure their system in a very flexible manner. PLL circuitries 210 and 410 can thus be used to generate multiple internal clock references as well as provide off-chip reference clocks. Advantageously, a single frequency divider circuit can be used to generate both an internal reference clock and an external clock reference. Other advantages include being able to dynamically switch to any of the multiple input reference signals (in PLL circuitry 410) and to any of the global or local clocks. Allowing a user to dynamically configure PLL circuitry of the invention avoids having to reprogram an entire PLD, which advantageously reduces overall system cost.

Figure 7:
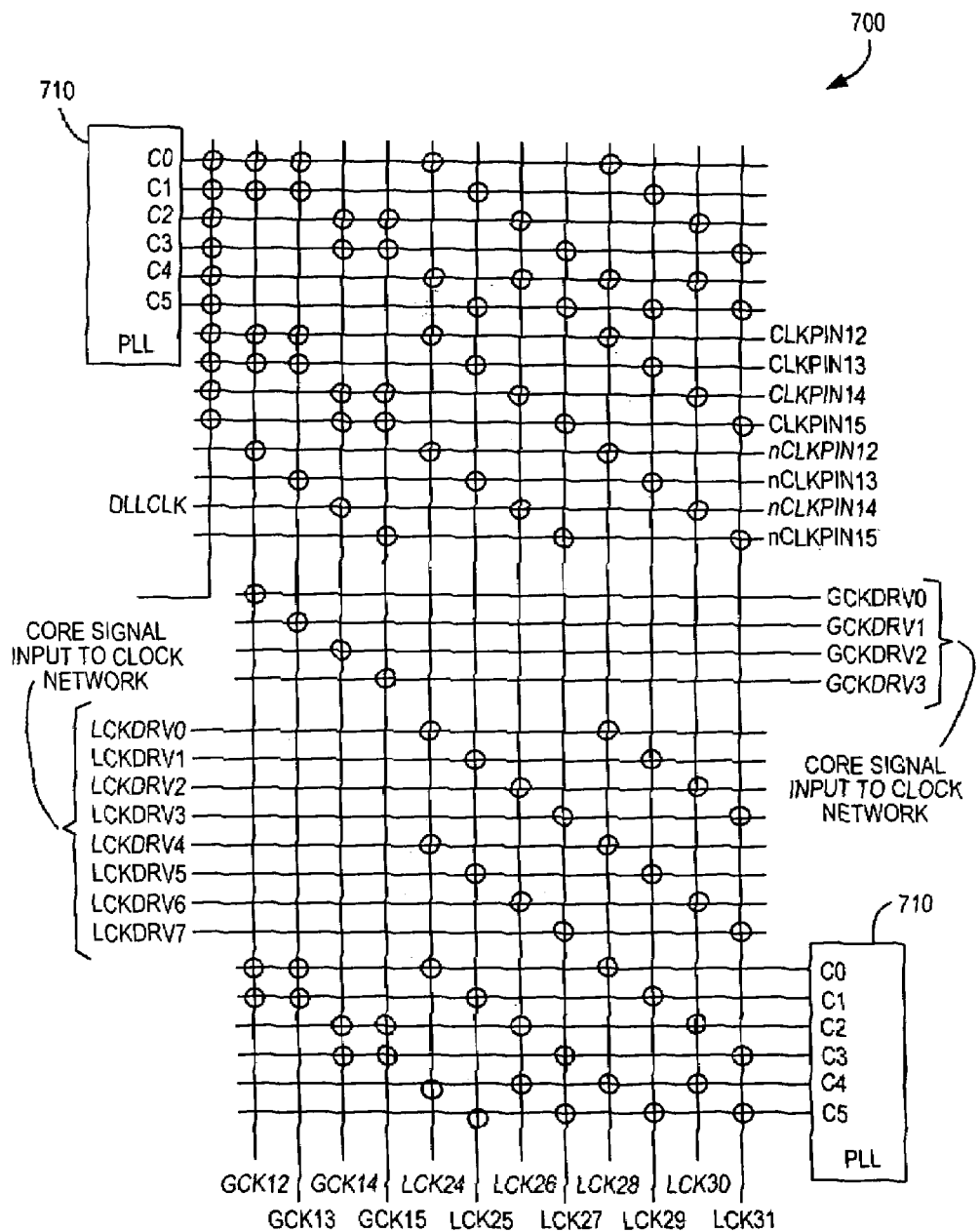
FIG. 7 is a simplified block diagram of a clock multiplexing pattern according to the invention.

FIG. 7 shows an example of a clock multiplexer pattern that can be used with PLL circuitries of the invention. Pattern 700 includes two general purpose PLL circuitries 710, which may be, for example, either PLL circuitry 210 or 410. Each vertical line can be thought of as a single multiplexer with each circle representing a signal that can connect to the multiplexer. CLKPIN# represents standard clock pins, while nCLKPIN# represent additional clock pins available when the input clock is not a differential signal. The GCKDRV# (global clock driver) and LCKDRV# (local clock driver) signals provide a way for generic logic to drive onto clock networks without having to first drive out via an I/O pin and then back into the clock network via another I/O pin. These multiplexer connections can be used for signals that have a high fanout.

Figure 8:
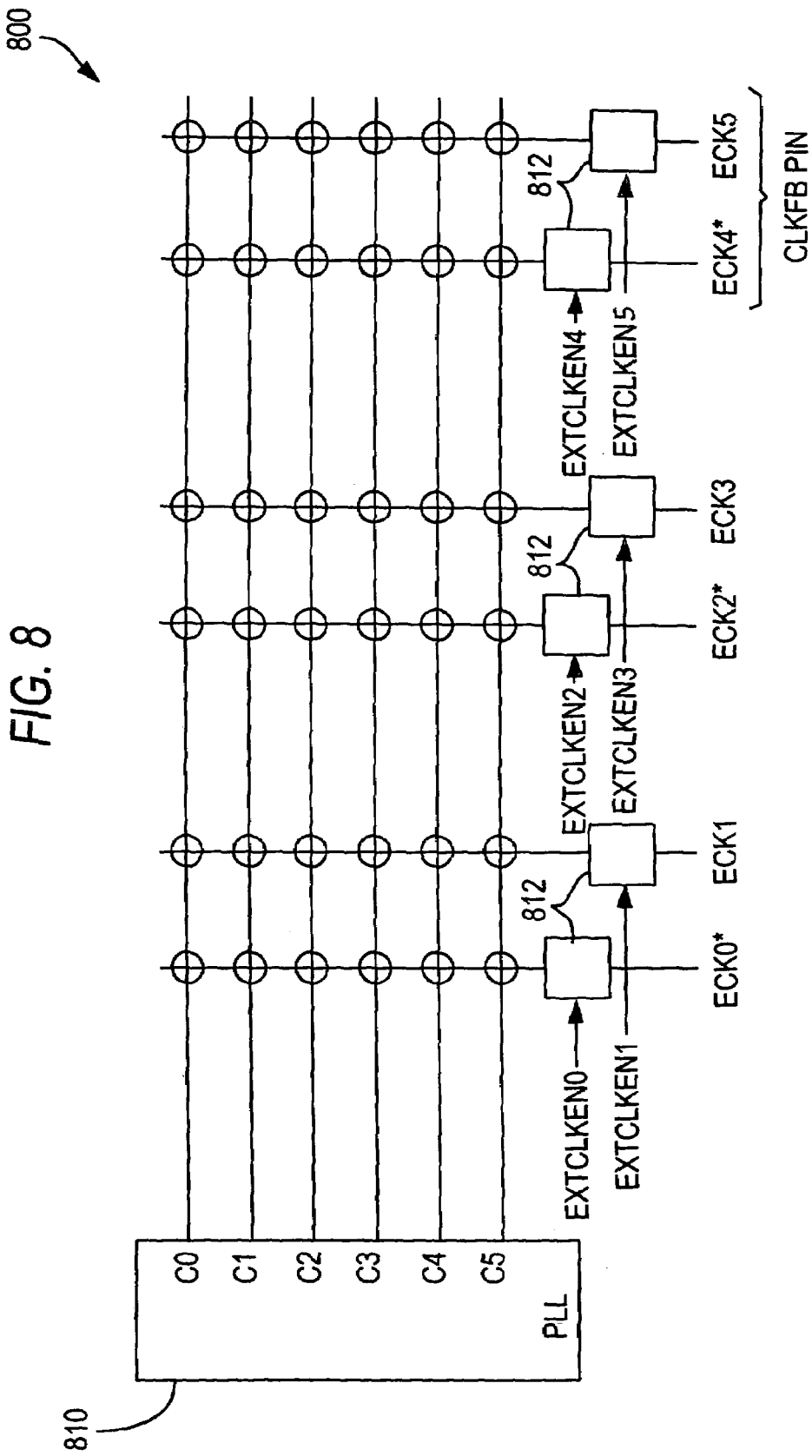
FIG. 8 is a simplified block diagram of an external clock multiplexing pattern according to the invention.

FIG. 8 shows an example of a multiplexer pattern for external clock outputs that can be used with PLL circuitries of the invention. Pattern 800 includes output pins 812 and general purpose PLL circuitry 810, which may be, for example, either PLL circuitry 210 or 410. Any output signal from PLL circuitry 810 can be routed to any output pin 812. The extclken# (external clock enable) signals advantageously allow a user to dynamically enable and disable clock pins synchronously. This can be used to implement a system power-down capability to reduce power consumption. Note that the even numbered outputs (i.e., ECK0, ECK2, . . . ) can be used with their adjacent odd numbered outputs (i.e., ECK1, ECK3, . . . ) for differential signaling.

Figure 9:
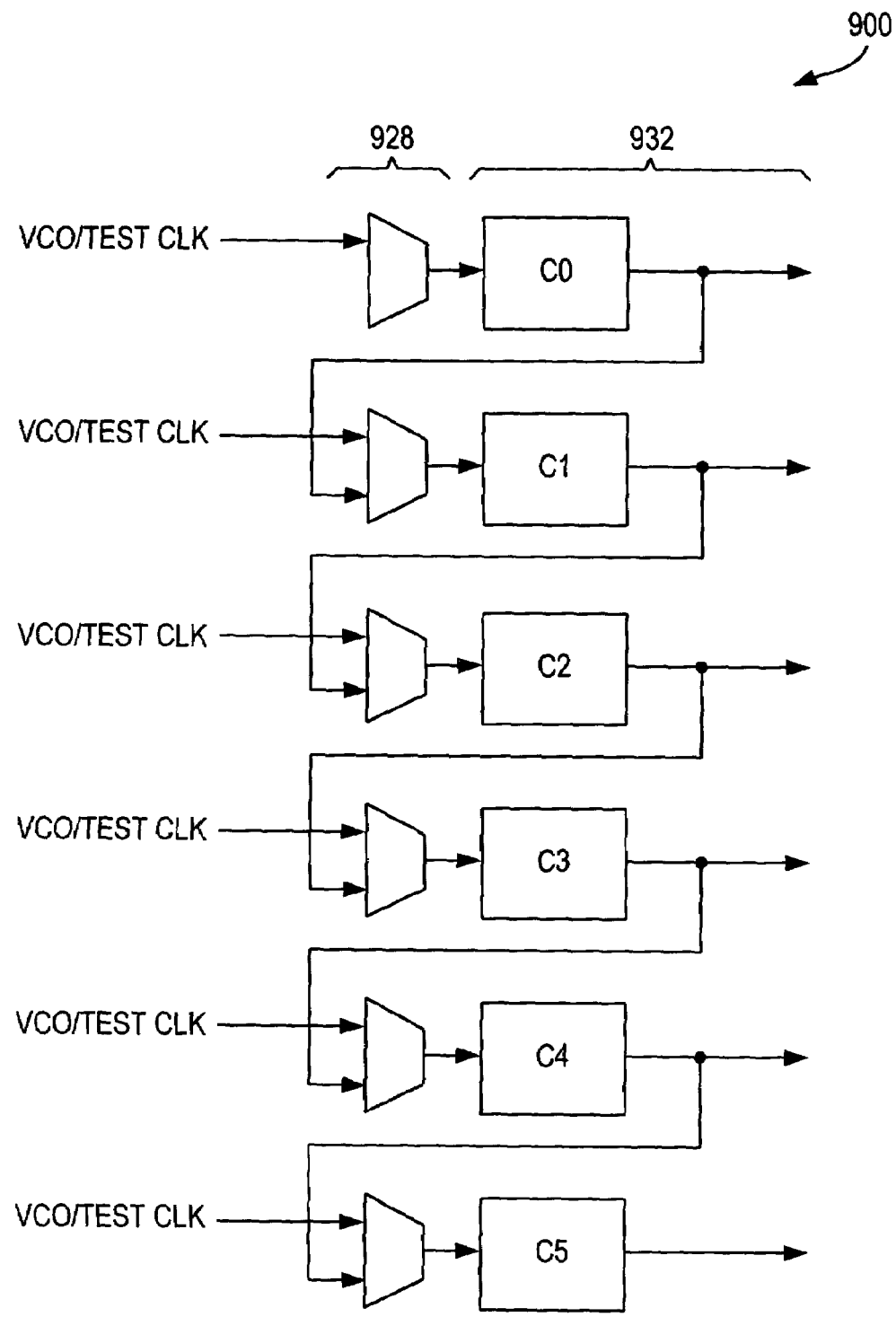
FIG. 9 is a simplified block diagram of a cascaded portion of PLL circuitry according to the invention.

FIG. 9 shows an alternative arrangement to multiplexer circuitries 228/428 and frequency-divider circuitries 232/432. Cascaded PLL output stage 900 advantageously allows PLL circuitries of the invention to programmably divide down signal frequencies by orders of magnitude. The output of any of the first n−1 frequency dividers 932 (where n is the total number of frequency dividers) can be programmably selected by the appropriate multiplexer of multiplexer circuitry 928 to be the input of the next frequency divider 932. Thus, for example, the output of frequency divider C0 can be used as an on-chip local clock and as an input to frequency divider C1. Moreover, the programmable cascading does not need to begin with the output of frequency divider C0, nor does it need to continue to the nth frequency divider (which in this embodiment is divider C5). For example, the output of divider C2 can be cascaded to divider C3, whose output can be cascaded to divider C4, while the outputs of dividers C0, C1, and C5 can be used independently. Note that the VCO/test clk input to each frequency divider represents the multiple VCO output signals.

Figure 10:
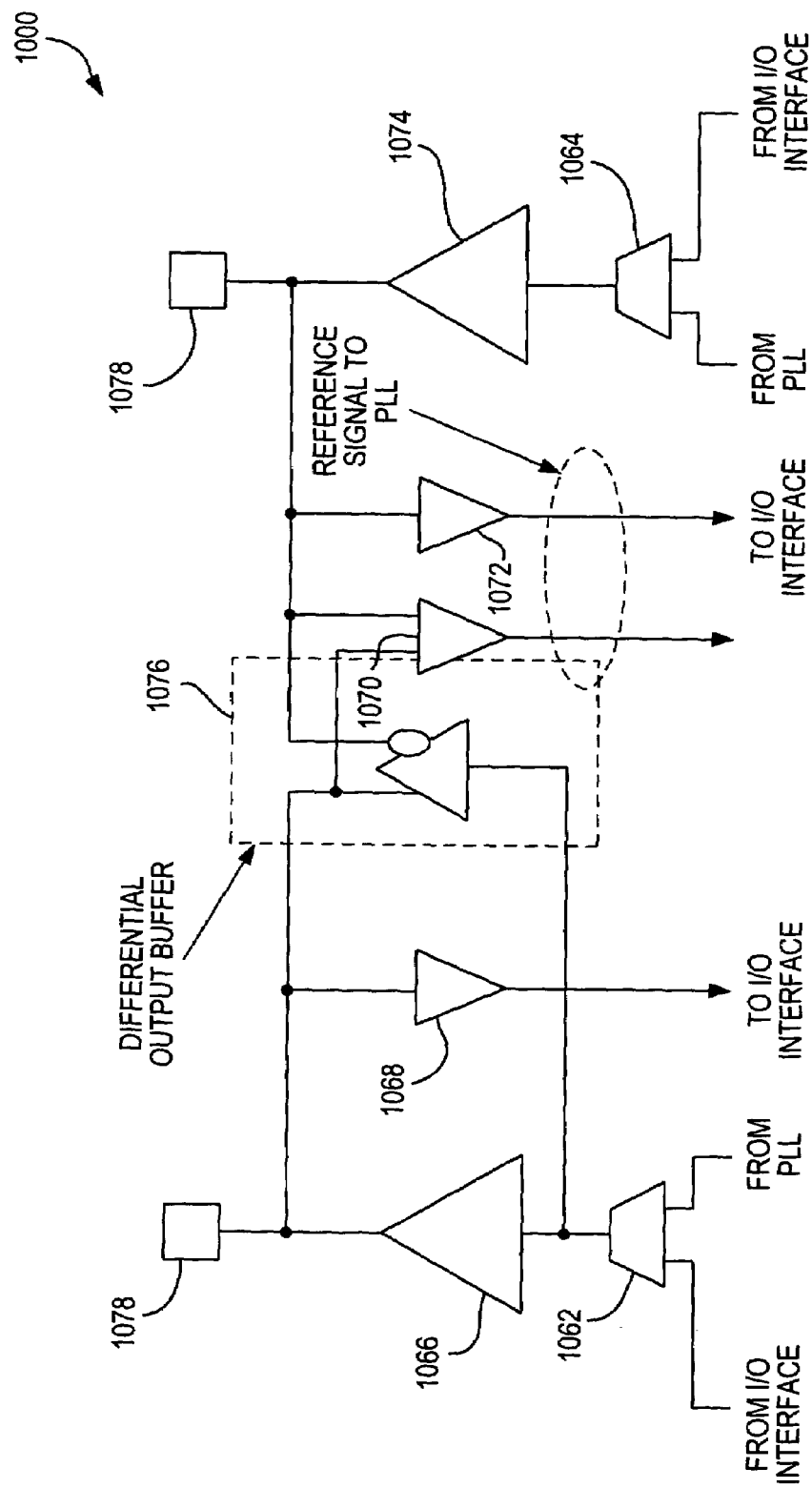
FIG. 10 is a simplified block diagram of configurable clock buffer circuitry according to the invention.

FIG. 10 shows an embodiment of configurable clock buffer circuitry in accordance with the invention. Advantageously, clock buffer circuitry 1000 supports generic I/O functionality as well as I/O clock functions and both input and output capability. Buffer circuitry 1000 includes multiplexers 1062 and 1064; buffer/drivers 1066, 1068, 1070, 1072, and 1074; and differential buffer 1076. Buffer circuitry 1000 is coupled to I/O-clock pins 1078 and can be configured to allow pins 1078 to be driven by PLL circuitry (thus making them clock pins) or to be driven by an I/O interface (thus making them generic I/O pins). Buffer circuitry 1000 can further be configured to allow one of pins 1078 to be used as a PLL external feedback pin (thus becoming a delay compensation buffer). When buffer circuitry 1000 is configured bidirectionally (allowing both input and output), PLL circuitry can be configured as a zero delay buffer. This is preferable to known methods of using delay cells because only the buffers being compensated out are used in this configuration.

Preferably, all clock sources (global clock, local clocks, and external clocks) associated with PLDs of the invention can be synchronously enabled and disabled. This allows users to dynamically shut down and turn on various portions of their design for power management. FIG. 11 shows synchronous PLL enablement circuitry in accordance with the invention. Enablement circuitry 1100 includes latch 1182, AND gate 1184, and clock driver 1186. Signal ENOUT is a core signal under user control used to dynamically control enabling and disabling of clocks. Signal ENOUTCTRL is a programming bit that allows the clock to always be enabled if a user does not use the disable feature. NPST is the register preset, which is active low, meaning that a low voltage signal (e.g., a logical 0 signal) at that input causes the output to go high.

Note that while multiplexers have been shown throughout the FIGS., they may be alternatively replaced with other types of programmable logic connectors (PLCs). For example, PLCs can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc.

Further note that PLDs having PLL circuitry of the invention are not limited to any one technology, but advantageously can be implemented in various technologies.

As mentioned above, PLCs (e.g., multiplexers) and divider circuits of the invention are programmable, and their programmable parameters may be stored in various types of programmable, function control elements ("FCEs") (although with certain implementations (e.g., fuses and metal optional links) separate FCE devices are not required.) FCEs can be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. The FCEs that control the PLCs and divider circuits of the invention are preferably programmed in the same way and at the same time that programmable logic 108 in FIG. 1 is programmed.

Figure 12:
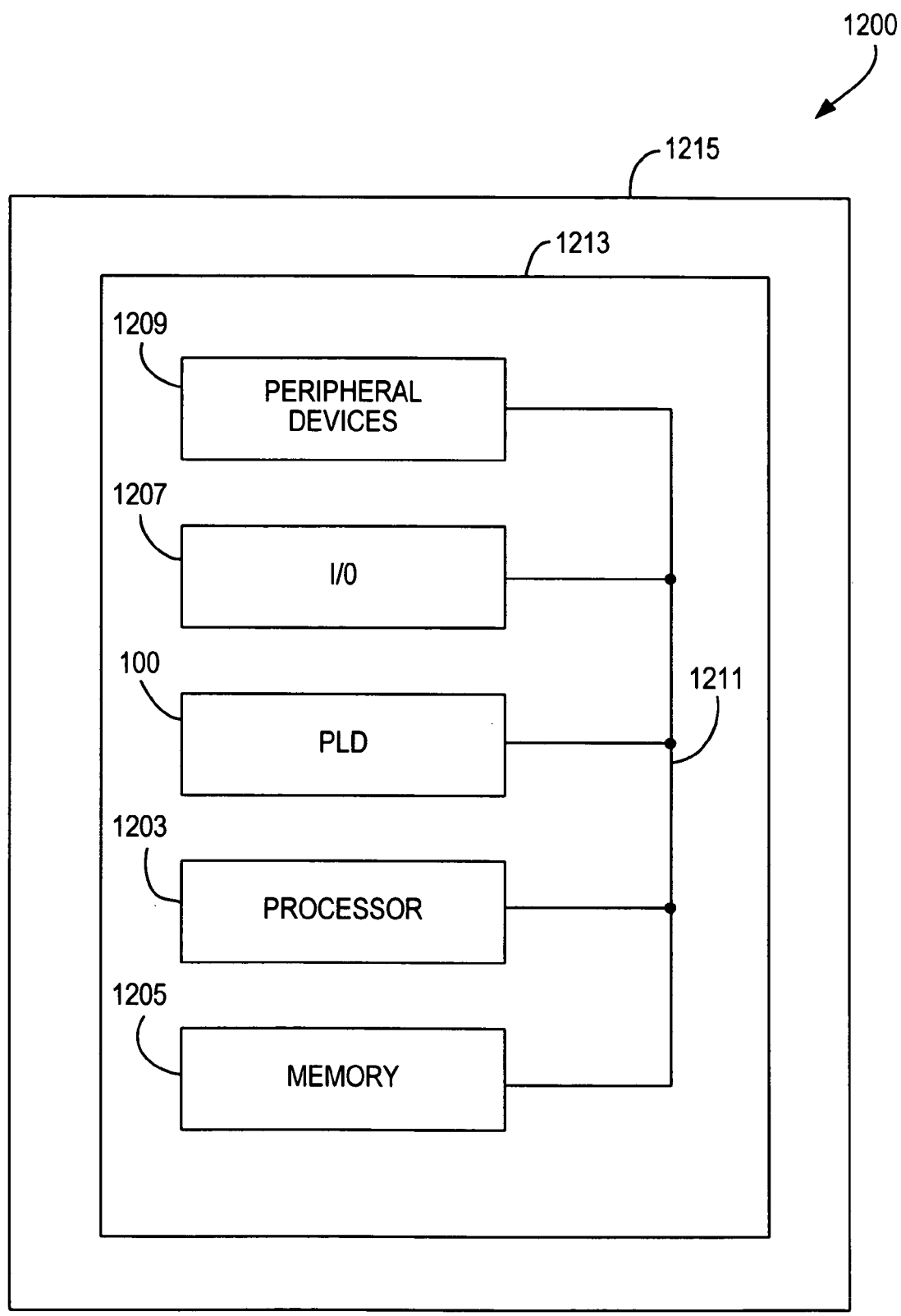
FIG. 12 is a simplified block diagram of an illustrative system employing the invention.

Although the circuitry of the invention has many possible applications, one illustrative use is shown in FIG. 12. Data processing system 1200 includes programmable logic device 100, which is an integrated circuit, and may be an integrated circuit chip, that includes PLL circuitry in accordance with the invention. PLD 100 may be field programmable, mask programmable, or programmable in any other way. It may be one-time-only programmable, or it may be reprogrammable. System 1200 may also include one or more of the following components: a processor 1203; memory 1205; I/O circuitry 1207; and peripheral devices 1209. These components are coupled together by a system bus 1211 and are populated on a circuit board 1213, which is contained in an end-user system 1215. Communication among the various components shown in FIG. 12, and/or with external circuitry, may be of any known type to any desired extent.

System 1200 can be used in a wide variety of applications, such as computer networking, data networking, instrumentation, video processing, digital signal processing, or any other application where the advantage of using programmable or reprogrammable logic is desirable. PLD 100 can be used to perform a variety of different logic functions. For example, PLD 100 can be configured as a processor or controller that works in cooperation with processor 1203. PLD 100 may also be used as an arbiter for arbitrating access to a shared resource in system 1200. In yet another example, PLD 100 can be configured as an interface between processor 1203 and one of the other components in system 1200. Note that system 1200 is only exemplary and in no way should be construed to limit the true scope and spirit of the invention.

Thus it is seen that highly configurable PLL circuitry outputting multiple signals having programmable phases and frequencies for programmable use as external or internal clocks is provided. One skilled in the art will appreciate that the invention can be practiced by other than the described embodiments, which are presented for purposes of illustration and not of limitation, and the invention is limited only by the claims which follow.

We claim:

1. A circuit for producing clock signals, the circuit comprising:
    a first multiplexer for selecting a reference signal from a plurality of input signals;
    a PLL circuit for receiving the reference signal and producing a plurality of phase-shifted signals, wherein the phase-shifted signals have the same frequency and different phases, and wherein the PLL circuit comprises a second multiplexer for selecting a feedback signal from the plurality of phase-shifted signals;
    a first divider circuit for dividing the frequencies of at least two of the phase-shifted signals to produce a plurality of output clock signals; and
    a third multiplexer for selecting one of the output clock signals.

2. The circuit of claim 1, wherein the PLL circuit further comprises:
    a phase/frequency detector circuit for receiving first and second input signals and producing a control signal based on the phase relationship between the first and second input signals;
    a voltage-controlled oscillator circuit for receiving the control signal and adjusting the frequency of the plurality of phase-shifted signals based on the control signal; and
    second and third divider circuits for producing the first and second input signals by dividing the frequencies of the reference signal and the feedback signal;
    whereby the phase detector circuit adjusts the control signal applied to the voltage-controlled oscillator circuit until the first and second input signals are in phase.

3. The circuit of claim 2, wherein the control signal is adjusted to increase the frequency of the plurality of phase-shifted signals when the phase of the first input signal leads the phase of the second input signal and the control signal is adjusted to decrease the frequency of the plurality of phase-shifted signals when the phase of the first input signal lags the phase of the second input signal.

4. The circuit of claim 1, wherein the first divider circuit is programmable to adjust the factors by which the frequencies of the phase-shifted signals are divided.

5. The circuit of claim 1, wherein the plurality of input signals are synchronized with an enable signal.

6. The circuit of claim 1, wherein the selected output clock signal is coupled to an output pin for use as an off-chip clock signal, a global clock network for use as an on-chip global clock signal, or a clock network for use as an on-chip local clock signal.

7. A method for producing clock signals, the method comprising:
    selecting a reference signal from a plurality of input signals;
    producing a plurality of phase-shifted signals, wherein the phase-shifted signals have the same frequency and different phases and producing the plurality of phase-shifted signals comprises selecting a feedback signal from the plurality of phase-shifted signals;
    dividing the frequencies of at least two of the phase-shifted signals to produce a plurality of output clock signals; and
    selecting one of the output clock signals.

8. The method of claim 7, wherein producing the plurality of phase-shifted signals further comprises:
    producing a control signal based on the phase relationship between first and second input signals;
    adjusting the frequency of the plurality of phase-shifted signals based on the control signal;
    producing the first and second input signals by dividing the frequencies of the reference signal and the feedback signal; and
    adjusting the control signal until the first and second input signals are in phase.

9. The method of claim 8, wherein the control signal is adjusted to increase the frequency of the plurality of phase-shifted signals when the phase of the first input signal leads the phase of the second input signal and the control signal is adjusted to decrease the frequency of the plurality of phase-shifted signals when the phase of the first input signal lags the phase of the second input signal.

10. The method of claim 7, wherein the frequency of each phase-shifted signal is divided by a programmably-controlled factor.

11. The method of claim 7, wherein the plurality of input signals are synchronized with an enable signal.

12. The method of claim 7, wherein the selected output clock signal is coupled to an output pin for use as an off-chip clock signal, a global clock network for use as an on-chip global clock signal, or a clock network for use as an on-chip local clock signal.

13. A circuit for synchronously providing a reference signal to a PLL circuit that is enabled by a PLL enable signal comprising:
    a multiplexer for selecting a reference signal from a plurality of clock signals;
    a latch for receiving the PLL enable signal and outputting the current value of the PLL enable signal at an edge of the reference signal opposite to the edge of the reference signal to which the PLL circuit is aligned; and
    an AND gate for providing the reference signal to the PLL circuit when the output of the latch is high;
    whereby upon enabling the PLL circuit, the PLL circuit receives the reference signal before the PLL circuit latches on to the reference signal.

14. The circuit of claim 13, wherein the latch is falling-edge aligned and the PLL circuit is rising-edge aligned.

15. The circuit of claim 13, wherein the latch is rising-edge aligned and the PLL circuit is falling-edge aligned.

16. The circuit of claim 13, wherein one of the plurality of clock signals is a core input signal that originates from an on-chip clock pin or is generated by another on-chip PLL circuit.

17. The circuit of claim 13, further comprising a switchover circuit that receives the reference signal and a second synchronized clock signal for dynamically providing either the reference signal or the second synchronized clock signal to the PLL circuit.

18. The circuit of claim 17, wherein the switchover circuit provides the second synchronized clock signal to the PLL circuit when the reference signal stops running.

19. The circuit of claim 18, wherein the reference clock signal and the second synchronized clock signal are redundant signals.

20. The circuit of claim 17, wherein the switchover circuit provides the second synchronized clock signal to the PLL circuit in response to receiving a user input.

* * * * *